United States Patent [19]

Faust et al.

[11] Patent Number: 5,262,244
[45] Date of Patent: Nov. 16, 1993

[54] HYDROPHILIC COPOLYMERS AND THEIR USE IN REPROGRAPHY

[75] Inventors: Raimund J. Faust, Wiesbaden; Silvia Lutz, Mainz; Engelbert Pliefke, Wiesbaden, all of Fed. Rep. of Germany

[73] Assignee: Hoechst Aktiengesellschaft, Frankfurt am Main, Fed. Rep. of Germany

[21] Appl. No.: 24,840

[22] Filed: Mar. 1, 1993

Related U.S. Application Data

[63] Continuation of Ser. No. 731,463, Jul. 17, 1991, abandoned.

[30] Foreign Application Priority Data

Jul. 21, 1990 [DE] Fed. Rep. of Germany ....... 4023268

[51] Int. Cl.$^5$ ................. B32B 15/08; C08F 220/58
[52] U.S. Cl. ........................... 428/463; 428/461; 526/265; 526/278; 526/287; 526/317.1; 526/318.4; 526/319; 526/320; 526/328; 526/329.7; 526/347
[58] Field of Search ............... 428/461, 463; 427/409; 526/287, 278, 317.1, 265

[56] References Cited

U.S. PATENT DOCUMENTS

| | | |
|---|---|---|
| 2,714,066 | 7/1955 | Jewett et al. .............. 430/155 |
| 2,991,204 | 7/1961 | Astle ........................ 428/447 |
| 3,181,461 | 5/1965 | Fromson ................... 430/275 |
| 3,232,783 | 2/1966 | Deal et al. ................. 428/436 |
| 3,276,868 | 10/1966 | Uhlig ......................... 430/60 |
| 3,280,734 | 10/1966 | Fromson ................... 430/161 |
| 3,298,852 | 1/1967 | Beatty et al. ............... 430/168 |
| 3,440,050 | 4/1969 | Chu ........................... 430/161 |
| 3,672,885 | 6/1972 | Ort ............................ 430/49 |
| 3,672,966 | 6/1972 | Geisler et al. .............. 205/204 |
| 3,733,200 | 5/1973 | Takaishi et al. ........... 430/276 |
| 3,769,043 | 10/1973 | Morishima et al. ....... 106/2 |
| 3,853,803 | 12/1974 | Anderson .................. 524/809 |
| 3,860,426 | 1/1975 | Cunningham et al. .... 430/278 |
| 3,861,917 | 1/1975 | Magnotta et al. ......... 430/305 |
| 3,902,976 | 9/1975 | Walls ......................... 205/127 |
| 3,927,199 | 12/1975 | Micchelli .................. 525/329.4 |
| 3,985,698 | 10/1976 | Matsudaira ................ 260/29.6 |
| 4,049,746 | 9/1977 | Muzyczko et al. ....... 525/163 |
| 4,116,695 | 9/1978 | Mori et al. ................ 430/164 |
| 4,153,461 | 5/1979 | Berghauser et al. ...... 430/160 |
| 4,208,212 | 6/1980 | Kuzuwata et al. ........ 106/2 |
| 4,275,092 | 6/1981 | Narayama ................ 427/54.1 |
| 4,293,635 | 10/1981 | Flint .......................... 430/271 |
| 4,420,549 | 12/1983 | Cadwell ..................... 430/158 |
| 4,427,765 | 1/1984 | Mohr et al. ................ 430/525 |
| 4,749,762 | 6/1988 | Foss .......................... 526/312 |

FOREIGN PATENT DOCUMENTS

| | | |
|---|---|---|
| 0149490 | 7/1985 | European Pat. Off. . |
| 815471 | 5/1959 | United Kingdom . |
| 907718 | 10/1962 | United Kingdom . |
| 1246696 | 9/1971 | United Kingdom . |
| 1414575 | 11/1975 | United Kingdom . |
| 1495895 | 12/1977 | United Kingdom . |
| 2026517A | 2/1980 | United Kingdom . |

*Primary Examiner*—Joseph L. Schofer
*Assistant Examiner*—Fred Zitomer
*Attorney, Agent, or Firm*—Foley & Lardner

[57] ABSTRACT

The invention relates to a hydrophilic copolymer having the general structure:

$$\ldots{-}(A)_m{-}\ldots{-}(B)_n{-}\ldots{-}(C)_o{-}\ldots{-}(D)_p{-}\ldots$$

in which
A is at least one polymerizable monomer having an acidic side group,
B is at least one polymerizable monomer having a basic side group,
C is at least one polymerizable monomer having a non-polar, non-hydrophilic side group, and
D is at least one polymerizable monomer capable of increasing the hydrophilic character of monomer A or to form a chelate with monomer A,
m, n, o and p are the monomer contents of monomers A, B, C and D, respectively, in mol %, with $m+n+o+p=100$ mol %, with the proviso that m and n are each $\geq 2$ mol % and p is $\geq 1$ mol %, wherein the copolymer is a linear copolymer having a random structure of the monomers. The copolymer is useful as a hydrophilizing agent for lithographic and offset printing plates, and as a binder in light-sensitive lithographic layers.

21 Claims, No Drawings

HYDROPHILIC COPOLYMERS AND THEIR USE IN REPROGRAPHY

This application is a continuation of application Ser. No. 07/731,463, filed Jul. 17, 1991 now abandoned.

BACKGROUND OF THE INVENTION

The invention relates to hydrophilic copolymers, built up from polymeric chains, which carry acidic and basic side groups, and to the use of these copolymers for hydrophilizing lithographic printing plates and as binders in light-sensitive lithographic layers.

To produce offset printing plates, suitable layer supports are provided on one or both sides with a light-sensitive layer (resist layer), by means of which a printing image is generated by photomechanical means. After the printing image has been produced, the layer support carries the printing image areas and, in the image-free areas (non-image areas) forms at the same time the hydrophilic image background for the lithographic printing process.

A layer support for light-sensitive layers, suitable for producing lithographic plates, must therefore meet the following requirements. First, the parts of the light-sensitive layer applied to the layer support, which are relatively readily soluble after exposure, must be detachable easily and without residue from the support in a developing process to produce the non-image areas. The support bared in the non-image areas must be highly hydrophilic, i.e. have a high affinity to water, so that it can rapidly absorb and permanently hold water during the lithographic printing step and thus sufficiently repel the greasy printing ink. The light-sensitive layer must also have adequate adhesion to the layer support; even the printing areas of the layer, which have remained after exposure and development, must still adhere sufficiently strongly to the support in order to achieve a long print run.

Foils of aluminum, steel, copper, brass or zinc and also plastic films or paper can be used as the starting material for such layer supports. These raw materials are converted to layer supports for offset printing plates by a suitable treatment of their surface, such as graining, matte chromium-plating, superficial oxidation and/or application of an interlayer. Aluminum, which is probably the most widely used base material for offset printing plates nowadays, is superficially roughened by known methods such as dry brushing, wet brushing, sandblasting, chemical and/or electrochemical treatment or a combination thereof. To increase the abrasion resistance, the aluminum thus roughened can also be subjected to an anodic oxidation in order to build up a thin oxide layer.

In practice, the support materials, especially aluminum-based, anodically oxidized support materials, are frequently subjected to a further treatment step before a light-sensitive layer is applied, for improving the layer adhesion, for increasing the hydrophilic character and/or for enhancing the developability of the light-sensitive layers. These include, for example, the following methods known from DE-C-907,147 (=U.S. Pat. No. 2,714,066), DE-B-1,471,707 (=U.S. Pat. No. 3,181,461 and U.S. Pat. No. 3,280,734) or DE-A-2,532,769 (=U.S. Pat. No. 3,902,976), which disclose processes for hydrophilizing printing plate support materials based on aluminum which may have been anodically oxidized. These materials are treated with aqueous sodium silicate solution, without or with the use of electric current.

DE-A-1,134,093 (=U.S. Pat. No. 3,276,868) and DE-C-1,621,478 (=U.S. pat. No. 4,153,461) have disclosed the use of polyvinyl-phosphonic acid or copolymers based on vinyl phosphonic acid, acrylic acid and vinyl acetate for hydrophilizing printing plate support materials based on aluminum which may have been anodically oxidized. The use of salts of these compounds is also mentioned, but not specified in more detail.

The use of complex fluorides of titanium, zirconium or hafnium according to DE-B-1,300,415 (=U.S. Pat. No. 3,440,050) also leads to additional hydrophilizing of aluminum oxide layers on printing plate support materials.

In addition to these most widely known hydrophilizing methods, the use of numerous polymers in this field of application has also been described. For example, in DE-B-1,056,931, the use of water-soluble, linear copolymers based on alkyl vinyl ethers and maleic anhydrides in light-sensitive layers for printing plates is described. In addition, those copolymers in which the maleic anhydride component has been reacted partially or fully with ammonia, an alkali metal hydroxide or an alcohol are also mentioned.

DE-B-1,091,433 has disclosed hydrophilizing of printing plate support materials based on metals by means of film-forming organic polymers, such as polymethacrylic acid or sodium carboxymethyl-cellulose or sodium hydroxyethyl-cellulose for aluminum supports or by means of a copolymer of methyl vinyl ether and maleic anhydride for magnesium supports.

According to DE-B-1,173,917 (=UK 907,719), water-soluble polyfunctional synthetic amino/urea-/aldehyde resins or sulfonated synthetic urea/aldehyde resins, which are cured on the metal support for conversion into a water-insoluble state, are used for hydrophilizing printing plate support materials of metals.

To produce a hydrophilic layer on printing plate support materials, a) an aqueous dispersion of a modified urea/formaldehyde resin, of an alkylated methylolmelamine resin or of a melamine/formaldehyde/-polyalkylenepolyamine resin and b) an aqueous dispersion of a polyhydroxy compound or polycarboxy compound, such as sodium carboxymethylcellulose are applied, according to DE-B-1,200,847 (=U.S. Pat. No. 3,232,783), successively to the support and the substrate c) thus coated is then treated with an aqueous solution of a salt of Zr, Hf, Ti or Th.

In DE-B-1,257,170 (=U.S. Pat. No. 2,991,204) a copolymer which, in addition to units of acrylic acid, acrylate, acrylamide or methacrylamide, also contains Si-trisubstituted vinylsilane units, is described as a hydrophilizing agent for printing plate support materials.

DE-A-1,471,706 (=U.S. Pat. No. 3,298,852) has disclosed the use of polyacrylic acid as a hydrophilizing agent for printing plate support materials of aluminum, copper or zinc.

According to DE-C-2,107,901 (=U.S. Pat. No. 3,733,200), the hydrophilic layer on a printing plate support material is formed from a water-insoluble hydrophilic homopolymer or copolymer of acrylate or methacrylate, having a water absorption of at least 20% by weight.

In DE-B-2,305,231 (=UK 1,414,575) hydrophilizing of printing plate support materials is described, in which a solution or dispersion of a mixture of an aldehyde and a synthetic polyacrylamide is applied to the support.

DE-A-2,308,196 (=U.S. Pat. No. 3,861,917) has disclosed hydrophilizing of roughened and anodically oxidized aluminum printing plate supports with ethylene/maleic anhydride copolymers or methyl vinyl ether/maleic anhydride copolymers, with polyacrylic acid, carboxymethylcellulose, sodium poly(vinylbenzene-2,4-disulfonic acid) or polyacrylamide.

In DE-B-2,364,177 (=U.S. Pat. No. 3,860,426), a hydrophilic adhesion layer for aluminum offset printing plates is described, which layer is located between the anodically oxidized surface of the printing plate support and the light-sensitive layer and which, in addition to a cellulose ether, also contains a water-soluble salt of Zn, Ca, Mg, Ba, Sr, Co or Mn. The layer weight of cellulose ether in the hydrophilic adhesion layer is 0.2 to 1.1 mg/dm$^2$, and the same layer weight is also quoted for the water-soluble salts. The mixture of cellulose ether and salt is applied to the support in aqueous solution, if appropriate with the addition of an organic solvent and/or of a surfactant.

According to U.S. Pat. No. 3,672,966, anodically oxidized aluminum surfaces are, before or during the sealing with hot water, treated with aqueous solutions of acrylic acid, polyacrylic acid, polymethacrylic acid, polymaleic acid or copolymers of maleic acid with ethylene or vinyl alcohol in order to avoid seal deposits.

According to U.S. Pat. No. 4,049,746, hydrophilizing agents for printing plate support materials contain salt-like reaction products of water-soluble polyacrylic resins having carboxyl groups and polyalkyleneimine/urea/aldehyde resins.

In UK 1,246,696, hydrophilic colloids such as hydroxyethylcellulose, polyacrylamide, polyethylene oxide, polyvinylpyrrolidone, starch or gum arabic, are described as hydrophilizing agents for anodically oxidized aluminum printing plate supports.

EP-B-0,149,490 describes, for hydrophilizing, compounds which additionally contain carboxyl groups or carboxylate groups, sulfo groups or hydroxyl groups, apart from amino groups. These compounds have a molecular weight of at most 1000.

The state of the art has also disclosed the use of metal complexes, which contain low-molecular ligands, for hydrophilizing printing plate support materials. Examples of such complexes are: complex ions of divalent or polyvalent metal cations and ligands, such as ammonia, water, ethylenediamine, nitric oxide, urea or ethylenediamine tetraacetate (DE-A-2,807,396=U.S. Pat. No. 4,208,212); iron cyanide complexes such as K$_4$(Fe(CN)$_6$) or Na$_3$(Fe(CN)$_6$) in the presence of heteropolyacids, such as phosphomolybdic acid or salts thereof, and of phosphates (U.S. Pat. No. 3,769,043 and/or U.S. Pat. No. 4,420,549); and iron cyanide complexes in the presence of phosphates and complex formers such as ethylenediamine tetraacetic acid for electrophotographic printing plates having a zinc oxide surface (U.S. Pat. No. 3,672,885).

In EP-A-0,069,320 (=U.S. Pat. No. 4,427,765), a process is described in which salts of polyvinylphosphonic acids, polyvinylsulfonic acids, polyvinylmethylphosphonic acids and other polyvinyl compounds are used as aftertreatment agents.

In DE-A-2,615,075 (=UK 1,495,895), a process for treating image-bearing offset printing plates with polyacrylamide or a mixture of polyacrylamide and polyacrylic acid is used.

In SU-A-647,142, a copolymer of acrylamide and vinyl monomers is used for hydrophilizing offset printing plates.

DE-C-1,091,433 describes a process for the aftertreatment of offset printing plate supports with polymers of methacrylic acid, methyl vinyl ether and maleic anhydride.

Acrylamide for the treatment of printing plate supports is also mentioned in DE-A-2,540,561.

For the same purpose, especially for improving the storage stability of printing plates, DE-A-2,947,708 describes, inter alia, Ni salt solutions of acrylamide and acrylic acid and also acrylamide and vinylpyrrolidone.

All the methods described above, are, however, affected by greater or lesser disadvantages, so that the support materials thus produced frequently no longer meet the current demands of offset printing with respect to developer resistance, hydrophilic properties, free-running behavior and steady print runs. Thus, after the treatment with alkali metal silicates, which lead to good developability and hydrophilic character, a certain deterioration in the storage stability of light-sensitive layers applied thereto must be accepted, and the print run of a printing plate thus aftertreated drop drastically.

Although the complexes of the transition metals in principle promote the hydrophilic character of anodically oxidized aluminum surfaces, they have the disadvantage of being very readily soluble in water, so that they can easily be removed during the development of the layer with aqueous developer systems which recently increasingly contain surfactants and/or chelate formers which have a high affinity to these metals. As a result, the concentration of the transition metal complexes on the surface is reduced to a greater or lesser extent, and this can lead to a weakening of the hydrophilic effect.

In the treatment of supports with water-soluble polymers without scope for anchorage, their high solubility, especially in aqueous-alkaline developers such as are predominantly used for developing positive-working, light-sensitive layers, also leads to a marked weakening of the hydrophilizing effect.

Monomeric hydrophilic compounds such as those described, for example, in EP-B-0,149,490, quite generally have the disadvantage of being washed away relatively rapidly from the bared non-image area surface during the development and printing process and losing their hydrophilic effect, since the anchorage points in the surface are insufficient.

The combination of a mixture of a water-soluble polymer, such as a cellulose ether, and a water-soluble metal salt leads, since the layer weights and hence the layer thickness are selected at a relatively high level (see DE-B-2,364,177), to reduced adhesion of the resist layer, and this can manifest itself, for example, in parts of the developer fluid undermining image areas during the development.

SUMMARY OF THE INVENTION

Accordingly, it is an object of the present invention to provide a high-polymeric hydrophilizing agent for support materials for offset printing plates which does not adversely affect the storage stability of the light-sensitive layers of the offset printing plates.

Another object of the present invention is to provide an agent which, in addition to good adhesion to the surface of the aluminum support on the one hand and to the light-sensitive layer on the other hand, effects a durable hydrophilic character of the non-image areas of the finished developed offset printing plates.

A further object of the present invention is to provide an agent which is difficult to wash out of the support material treated with it.

Still another object of the present invention is to provide a binder in a light-sensitive photopolymer system which can be stripped in an aqueous medium.

Yet another object of the present invention is to provide a process for producing the agent and binder.

In accomplishing the foregoing objectives, there has been provided, in accordance with one aspect of the present invention, a hydrophilic copolymer having the general structure:

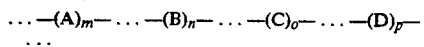

in which

A is at least one polymerizable monomer having an acidic side group,

B is at least one polymerizable monomer having a basic side group,

C is at least one polymerizable monomer having a non-polar, non-hydrophilic side group, and D is at least one polymerizable monomer capable of increasing the hydrophilic character of monomer A or to form a chelate with monomer A, m, n, o and p are the monomer contents of monomers A, B, C and D, respectively, in mol %, with $m+n+p+o+p=100$ mol %, with the proviso that m and n are each $\geq 2$ mol % and p is $\geq 1$ mol %, wherein the copolymer is a linear copolymer having a random structure of the above-described monomers. Preferably, the polymerizable monomers are free-radically polymerizable.

In accordance with another aspect of the present invention there is provided a process for producing the above-described hydrophilic copolymer which comprises the step of free-radically polymerizing monomers A, B, C and D in the presence of a free-radical initiator.

Lithographic and offset printing plates comprising the inventive copolymer as a hydrophilizing agent, light-sensitive mixtures comprising the inventive copolymer as a binder, and light-sensitive recording materials comprising light-sensitive layers which include the inventive copolymer as a binder are also provided.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The copolymers of the type described above are not only highly effective hydrophilizing agents which, in addition, can be prepared in a simple manner, but they can also be used with advantage as binders in light-sensitive layers. The degree of the solubility of the light-sensitive layer can be varied as desired and very advantageously adjusted by varying the type and quantity of the basic monomers.

The concentration of the hydrophilic groups can be selected such that the polymers according to the invention are suitable as binders for light-sensitive layers, with aqueous or aqueous/alcoholic stripping. At an even higher concentration of the hydrophilic groups, they can also be used as hydrophilizing agents. The hydrophilic polymers are distinguished by having, along a polymeric chain, acidic and basic side groups which are ionizable and capable of forming salts.

The hydrophilic copolymers which, inter alia, are used as hydrophilizing agents, are linear polymers with acidic and basic side groups and have the following structure:

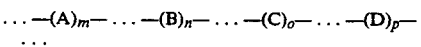

with $m+n+o+p=100$ mol %.

The values of m and n are in the range from about 2 to 97 mol % and follow mutually opposed curves, i.e. a high value of m corresponds to a low value of n, and vice versa. Preferably, however, m and n are approximately equal, i.e., A and B are present in an approximately equimolar ratio. The resulting range for the value o is about 0 to 95 mol %, and that for p is about 1 to 96 mol %. In particular, the values o and p are within the ranges of about 10 to 50 mol % and about 1 to 20 mol % respectively.

The polymeric hydrophilizing agents have a random structure and average molecular weights of at least 1,000, preferably about 5,000 to 50,000, but polymers having a molecular weight even higher than 50,000 can also be used with technical advantage.

The monomer types A, B, C and D are exemplified below:

Monomer Type A

Acrylic acid, methacrylic acid, maleic acid, fumaric acid, itaconic acid, and monoesters of aliphatic and cycloaliphatic alcohols having 1 to 17 carbon atoms with maleic acid, fumaric acid, and itaconic acid, vinylsulfonic acid, vinylbenzoic acid, vinylphosphonic acid and other polymerizable monomers containing acidic groups.

Monomer Type B

Dimethylaminoethyl acrylate and methacrylate, diethylaminoethyl acrylate and methacrylate, dimethylaminopropyl acrylate and methacrylate, dimethylaminobutyl acrylate and methacrylate, and other monomers suitable for polymerization and containing amino groups. Vinylpyridine, styrenes containing dialkylamino groups and many others are also suitable.

Monomer Type C

Acrylates, methacrylates, maleates, fumarates, and itaconates of aliphatic and cycloaliphatic alcohols having 1 to 17 carbon atoms, styrene and substituted styrenes, vinyl chloride and other non-polar, non-hydrophilic monomer units. The use of the monomer type C and the concentration thereof allow a defined adjustment of the solubility of the copolymers.

Monomer Type D

Monomer units which are able to boost the hydrophilic character of monomer type A and/or to form chelates with monomer type A, for example hydroxylated acrylates of the type of hydroxyethyl acrylate or polyethylene glycol monoacrylate or polypropylene glycol monoacrylate, or the corresponding monomethacrylates.

More than one of each of monomer types A, B, C and/or D can be used in producing the hydrophilic agents according to the invention.

The synthesis of the hydrophilizing agents is advantageously carried out by a polymerization, initiated by free radicals, in organic solvents.

The free-radical initiators used can be the conventional compounds, such as peroxides, for example benzoyl peroxide, or azo compounds such as azobisisobutyronitrile (AIBN). In addition, regulators for adjusting the molecular weight can be used. The polymerization in non-polar solvents, carried out as a precipitation polymerization, has the advantage that low-molecular, oligomeric and chemically inhomogeneous fractions, for example products which contain only a few ionizable groups, remain in solution and can thus easily be separated from the precipitated polymers. This type of polymerization also has the advantage that it is simple and economical. The precipitation polymerization in organic solvents such as, for example, in petroleum spirit fractions in the suitable boiling point range from 100° to 140° C. can be carried out very easily and with good yield of copolymers in which the ionizable monomer units of types A and B are present in the preferably used concentrations of m n 10 to 50 mol %. At concentrations in the range of m and n=2 to 10 mol %, the polymers are isolated by distilling off the organic solvent.

The examples which follow explain the fundamental polymerization method for some preferred copolymers, but the invention is not restricted to the examples given.

The support materials used are preferably aluminum supports such as are described in German Application P 40 23 267.0 (corresponding to docket No. 16878/403), filed simultaneously. The manner in which these aluminum supports are coated or surface-treated with the hydrophilizing agents according to the invention is also described in detail in this application. The hydrophilizing agents are anchored in the way of an "absorption", a "complex formation" or a "salt formation" on the specially pretreated aluminum surface in such a way that a permanent hydrophilic character is obtained.

EXAMPLE 1

A copolymer of methacrylic acid, dimethylaminoethyl methacrylate, ethyl acrylate and a hydroxyethyl methacrylate chain-extended with 4.5 mol of ethylene oxide per mole is prepared. For this purpose

| | |
|---|---|
| 524 g | of dimethylaminoethyl methacrylate |
| 300 g | of ethyl acrylate |
| 287 g | of methacrylic acid and |
| 34 g | of hydroxyethyl methacrylate which was reacted for chain extension with 4.5 mol of ethylene oxide per mole, were dissolved in |
| 1145 g | of methyl ethyl ketone (MEK). |

1145 g of methyl ethyl ketone, 20% by weight of the solution of monomers described above and 1% by weight of azobisisobutyronitrile (AIBN), relative to the total weight of the monomers, are introduced under a nitrogen blanket gas atmosphere into a three-necked flask provided with a stirrer, reflux condenser, dropping funnel with pressure balance line and a gas inlet tube, and polymerized for 1 hour. Using a dropping funnel, the remaining monomer mixture is then added within 1 hour and the whole is polymerized for a further 2 hours under reflux. A further 0.5% by weight of azobisisobutyronitrile is then added and the polymerization is continued for 2 hours under reflux. The product is worked up by filtering off the precipitate formed with suction and washing the precipitate with three times 500 ml of methyl ethyl ketone.

The product is dried at 70° C.

Yield: 78%

The copolymer has outstanding hydrophilizing properties for aluminum supports. It forms a clear solution in an aqueous 2N $Na_2CO_3$ solution.

Completely analogously to the polymerization method described in Example 1, the copolymers listed in the following table (Examples 2 and 3) can be prepared.

| | Example 2 | Example 3 |
|---|---|---|
| Monomer A | Methacrylic acid 30 mol % | Vinylphosphonic acid 20 mol % |
| Monomer B | DMAEMA[1] 30 mol % | DMAEMA[1] 20 mol % |
| Monomer C | Ethyl acrylate 30 mol % | Ethyl acrylate 50 mol % |
| Monomer D | Esterification product of PEG (350)[2] monomethyl ether with methacrylic acid 10 mol % | Esterification product of PEG (350)[2] monomethyl ether with methacrylic acid 10 mol % |
| Solvent | MEK 67 parts by weight | MEK 67 parts by weight |
| AIBN | 1.5% by weight, relative to monomer | 1.5% by weight, relative to monomer |
| Yield | 92% by weight | 90% by weight |

[1] DMAEM = dimethylaminoethyl methacrylate
[2] PEG (350) = polyethylene glycol of molecular weight 350

What is claimed is:

1. A lithographic substrate comprising an aluminum support and, applied to at least one surface of the aluminum support, a hydrophilizing agent comprising a hydrophilic copolymer having the general structure:

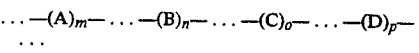

in which

A is at least one polymerizable monomer having an acidic side group,

B is at least one polymerizable monomer having a basic side group,

C is at least one polymerizable monomer having a non-polar, non-hydrophilic side group, and D is at least one polymerizable monomer capable of increasing the hydrophilic character of monomer A or to form a chelating agent with monomer A, m, n, o and p are the monomer contents of monomers A, B, C and D, respectively, in mol %, with m+n+o+p=100 mol %, with the proviso that m and n are each $\geq 2$ mol % and p is $\geq 1$ mol %, wherein said polymer is a linear polymer having a random structure of said monomers.

2. A lithographic substrate as claimed in claim 1, wherein said monomers A, B, C and D of the hydrophilic copolymer are free-radically polymerizable.

3. A lithographic substrate as claimed in claim 2, wherein monomer A of the hydrophilic copolymer is selected from the group consisting of acrylic acid, methacrylic acid, maleic acid, fumaric acid, itaconic acid, maleic acid, maleic acid monoesters, fumaric acid monoesters, itaconic acid monoesters, vinylsulfonic acid, vinylbenzoic acid and vinylphosphonic acid.

4. A lithographic substrate as claimed in claim 1, wherein monomer B of the hydrophilic copolymer contains side groups with tertiary amino groups.

5. A lithographic substrate as claimed in claim 4, wherein monomer B of the hydrophilic copolymer is selected from the group consisting of dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, dimethylaminobutyl acrylate and dimethylaminobutyl methacrylate.

6. A lithographic substrate as claimed in claim 1, wherein monomer B of the hydrophilic copolymer is a dialkylamino-substituted styrene or vinylpyridine.

7. A lithographic substrate as claimed in claim 1, wherein monomer C of the hydrophilic copolymer is selected from the group consisting of acrylates and methacrylates of aliphatic alcohols having 1 to 17 carbon atoms, styrene, alkyl-substituted styrenes, vinyl chloride, maleates, fumarates and itaconates.

8. A lithographic substrate as claimed in claim 7, wherein monomer C of the hydrophilic copolymer is methyl acrylate, methyl methacrylate, ethyl acrylate or ethyl methacrylate.

9. A lithographic substrate as claimed in claim 1, wherein monomer D of the hydrophilic copolymer is selected from the group consisting of hydroxylated alkyl acrylates, hydroxylated alkyl methacrylates, polyethylene glycol monoacrylate, polyethylene glycol monomethacrylate, polypropylene glycol monoacrylate or polypropylene glycol monomethacrylate.

10. A lithographic substrate as claimed in claim 1, wherein said monomers A of the hydrophilic copolymer are present in a quantity of $m=2$ to 97 mol % and simultaneously said monomers B of the hydrophilic copolymer are present in a quantity of $n=97$ to 2 mol %.

11. A lithographic substrate as claimed in claim 10, wherein said monomers A and B of the hydrophilic copolymer are in approximately equal ratio.

12. A lithographic substrate as claimed in claim 1, wherein said monomers A and B of the hydrophilic copolymer are each present in a quantity from about 10 to 50 mol %.

13. A lithographic substrate as claimed in claim 11, wherein said monomers A and B of the hydrophilic copolymer are each present in a quantity from about 10 to 50 mol %.

14. A lithographic substrate as claimed in claim 1, wherein said monomer C is present in a quantity (o) from about 2 to 95 mol %.

15. A lithographic substrate as claimed in claim 14, wherein said monomer C of the hydrophilic copolymer is present in a quantity (o) from about 10 to 50 mol %.

16. A lithographic substrate as claimed in claim 1, wherein said monomer D of the hydrophilic copolymer is present in a quantity (p) from 1 to 96 mol %.

17. A lithographic substrate as claimed in claim 16, wherein said monomer D of the hydrophilic copolymer is present in a quantity (p) from 1 to 20 mol %.

18. A lithographic substrate as claimed in claim 1, wherein said hydrophilic copolymer has an average molecular weight of at least 1000.

19. A lithographic substrate as claimed in claim 18, wherein said hydrophilic copolymer has an average molecular weight from about 5000 to 50,000.

20. A lithographic substrate as claimed in claim 1, wherein said lithographic substrate is an offset printing plate.

21. A lithographic substrate as claimed in claim 1, additionally comprising a layer of a light-sensitive mixture coated on said hydrophilizing layer.

* * * * *